(12) United States Patent
Arnold et al.

(10) Patent No.: US 7,880,241 B2
(45) Date of Patent: Feb. 1, 2011

(54) LOW-TEMPERATURE ELECTRICALLY ACTIVATED GATE ELECTRODE AND METHOD OF FABRICATING SAME

(75) Inventors: John C. Arnold, Ridgefield, CT (US); Stephen W. Bedell, Wappingers Falls, NY (US); Keith E. Fogel, Hopewell Junction, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 11/678,338

(22) Filed: Feb. 23, 2007

(65) Prior Publication Data
US 2008/0203447 A1 Aug. 28, 2008

(51) Int. Cl.
*H01L 21/02* (2006.01)

(52) U.S. Cl. .............. 257/410; 257/192; 257/288; 257/900; 257/E21.626; 257/E21.205; 257/E21.624; 438/240; 438/287; 438/303; 438/305; 438/387; 438/585; 438/595

(58) Field of Classification Search .......... 257/288, 257/295, 192, 410, 900, E21.626, E21.205, 257/E21.624; 438/591, 585, 287, 240, 595, 438/592, 303, 305, 387
See application file for complete search history.

(56) References Cited

U.S. PATENT DOCUMENTS

| | | | |
|---|---|---|---|
| 5,250,452 | A | 10/1993 | Ozturk et al. |
| 6,333,229 | B1 | 12/2001 | Furukawa et al. |
| 6,429,109 | B1 * | 8/2002 | Zheng et al. ........ 438/591 |
| 6,700,170 | B1 | 3/2004 | Morosawa et al. |
| 6,703,291 | B1 | 3/2004 | Boyanov et al. |
| 6,800,536 | B2 * | 10/2004 | Kurata .............. 438/387 |

(Continued)

OTHER PUBLICATIONS

Monget, C.; Schiltz, A.; Joubert, O.; Vallier, L.; Guillermet, M.; Tormen, B.; Germanium etching in high density plasmas for 0.18um complementary metal-oxide-semiconductor gate patterning applications; Journal of Vacuum Science & Technology B: Microelectronics and Nanometer Structures, vol. 16, Issue 4, Jul. 1998, p. 1833-1840.*

Zhaoqi, Sun; Chunrong, Liu; Plasma anodic oxidation and nitridation fo Ge(111) surface; Semiconductor Science Technology, vol. 8, No. 9 1993; p. 1779-1782.*

Hellberg et al., Oxidation of silicon-germanium alloys. I. An experimental study. J. Appl. Phys. 82(11), Dec. 1, 1997; p. 5773-5778.*

(Continued)

*Primary Examiner*—Fernando L Toledo
*Assistant Examiner*—John P Dulka
(74) *Attorney, Agent, or Firm*—Scully, Scott, Murphy & Presser, P.C.; Louis J. Percello, Esq.

(57) ABSTRACT

A gate electrode structure is provided, which includes, from bottom to top, an optional, yet preferred metallic layer, a Ge rich-containing layer and a Si rich-containing layer. The sidewalls of the Ge rich-containing layer include a surface passivation layer. The inventive gate electrode structure serves as a low-temperature electrically activated gate electrode of a MOSFET in which the materials thereof as well as the method of fabricating the same are compatible with existing MOSFET fabrication techniques. The inventive gate electrode structure is electrically activated at low processing temperatures (on the order of less than 750° C.). Additionally, the inventive gate electrode structure also minimizes gate-depletion effects, does not contaminate a standard MOS fabrication facility and has sufficiently low reactivity of the exposed surfaces that renders such a gate electrode structure compatible with conventional MOSFET processing steps.

19 Claims, 5 Drawing Sheets

U.S. PATENT DOCUMENTS

| | | | |
|---|---|---|---|
| 6,869,868 B2 * | 3/2005 | Chiu et al. | 438/592 |
| 6,876,045 B2 * | 4/2005 | Takagi | 257/408 |
| 6,946,369 B2 | 9/2005 | Mazen et al. | |
| 2004/0235229 A1 * | 11/2004 | Hokazono | 438/199 |
| 2005/0170597 A1 | 8/2005 | Yasutake | |
| 2007/0077716 A1 * | 4/2007 | Chen et al. | 438/300 |

OTHER PUBLICATIONS

Monget et al., Germanium etching in high density plasmas for 0.18 um complementary metal-oxide-semiconductor gate patterning applications. J. Vac. Sci. Technol. B 16 (4) Jul./Aug. 1998; p. 1833-1840.*

Zhaoqi et al., Plasma anodic oxidation and nitridation of Ge(111) surface. Semicond. Sci. Technol. 8 (1993); p. 1779-1782.*

* cited by examiner

LOW-TEMPERATURE ELECTRICALLY ACTIVATED GATE ELECTRODE AND METHOD OF FABRICATING SAME

FIELD OF THE INVENTION

The present invention relates to a semiconductor structure and a method of fabricating the same. More particularly, the present invention relates to a low-temperature electrically activated gate electrode useful as an element of a metal oxide semiconductor field effect transistor (MOSFET) as well as a method of fabricating such a gate electrode.

BACKGROUND OF THE INVENTION

During the fabrication of modern silicon (Si)-based metal oxide semiconductor field effect transistors (MOSFETs), a number of thermal processes are required to be performed. One of the highest thermal budget steps employed in a MOSFET fabrication sequence is that required to electrically activate the polycrystalline silicon (e.g., poly-Si) gate electrode, which has been the industry standard material. For example, a temperature on the order of about 900° C. or greater is typically employed to electrically activate prior art poly-Si gate electrodes.

As other materials are being considered for use in high-performance MOSFET devices, such as, for example, a germanium (Ge)-channel region, high temperature processing steps can no longer be tolerated. In the case of Ge, for example, the Ge will melt at a temperature of about 940° C. Also, the material for the gate electrode must be compatible (i.e., non-contaminating) with the various cleaning and processing tools used to fabricate MOSFET devices.

The use of polycrystalline germanium (e.g., poly-Ge) as a gate electrode material has been disclosed in U.S. Pat. No. 5,250,452 by Ozturk et al. as a feasible low-temperature replacement material for poly-Si gates. In accordance with the disclosure of the '452 patent, a method is provided in which a layer of polycrystalline silicon is deposited on a silicon dioxide layer to a thickness which is thick enough to support the subsequent deposition of germanium thereon.

The problem with the approach disclosed in the '452 patent is twofold. First, and as stated above, the '452 patent requires that a poly-Si layer be formed directly atop the silicon dioxide gate dielectric in order to be capable of growing a Ge layer. This is required in the '452 patent since poly-Ge does not effectively grow on silicon dioxide as does poly-Si. One of the major concerns in modern integrated circuit (IC) manufacturing is to minimize the gate-depletion effects in which the reduced conductivity of the lower portion of the gate electrode acts as a parasitic capacitance. The poly-Si layer employed in the '452 patent described above would exacerbate this problem even further than it exists currently because the poly-Si layer would never be properly activated by the low-temperature process proposed.

The second issue with using a poly-Ge gate material is due to the significantly increased chemical reactivity (as compared to poly-Si) with most standard Si-based processes including, for example, both wet and dry etching processes. Because of this enhanced reactivity, degradation of the poly-Ge gate material may occur during the various IC fabrication steps.

In view of the above, there is needed a method of fabricating a metal oxide semiconductor (MOS) gate electrode that is electrically activated at low processing temperatures. By "low processing temperatures" it is meant a temperature that is less than 750° C. A method of fabricating a MOS gate electrode is also needed that minimizes gate-depletion effects, does not contaminate a standard MOS fabrication facility and has sufficiently low reactivity of the exposed surfaces that renders such a MOS gate electrode compatible with conventional MOSFET processing steps.

SUMMARY OF THE INVENTION

The present invention is directed to a gate electrode structure, which includes, from bottom to top, an optional, yet preferred metallic layer, a Ge rich-containing layer and a Si rich-containing layer. The term "Ge rich-containing layer" denotes a material in which the Ge content is greater than about 40 atomic % Ge up to, and including, 100 atomic % Ge. The term "Si rich-containing layer" includes a material in which the Si content is about 60 atomic % or greater, up to, and including 100 atomic % Si. As such, the term 'Ge rich-containing' includes Ge alloys, such as SiGe in which the Ge content is greater than 40 atomic %, as well as pure Ge, while the term 'Si rich-containing' includes Si alloys, such as SiGe in which the Si content is about 60 atomic % or greater as well as pure Si.

The inventive gate electrode structure serves as a low-temperature electrically activated gate electrode of a MOSFET in which the materials thereof as well as the method of fabricating the same are compatible with existing MOSFET fabrication techniques.

The inventive gate electrode structure is electrically activated at low processing temperatures (on the order of less than 750° C.). Additionally, the inventive gate electrode structure also minimizes gate-depletion effects, does not contaminate a standard MOS fabrication facility and has sufficiently low reactivity of the exposed surfaces that renders such a gate electrode structure compatible with conventional MOSFET processing steps.

In addition to a general method of fabricating such a low-temperature gate electrode, the present invention also discloses a means for passivating exposed surfaces of the Ge rich-containing layer including the top surface of the deposited Ge rich-containing layer as well as the exposed sidewall surfaces of the Ge rich-containing layer after gate definition and patterning have been performed.

In general terms, the inventive gate electrode structure comprises:

a patterned material stack located on a surface of a gate dielectric, said patterned material stack comprising, from bottom to top, a Ge rich-containing layer and a Si rich-containing layer, wherein sidewall portions of the Ge rich-containing layer include a surface passivation layer.

In one embodiment of the present invention, the patterned material stack includes a metallic layer located beneath the Ge rich-containing layer directly on a surface of the gate dielectric.

The inventive gate electrode structure can be used as an element of a MOSFET.

In addition to providing a gate electrode structure, the present invention also provides a method of forming the same. The inventive method includes:

providing a material stack comprising, from bottom to top, a Ge rich-containing layer and a Si rich-containing layer, on a surface of a gate dielectric;

patterning the Si rich-containing layer and the Ge rich-containing layer by lithography and etching to provide at least one patterned material stack on said surface of said gate dielectric; and passivating sidewall portions of the Ge rich-containing layer of the at least one patterned material stack.

In some embodiments of the present invention, the metal stack further includes a metallic layer located beneath the Ge rich-containing layer directly on the surface of the gate dielectric layer. In such embodiments, the etching step stops on the surface of the metallic layer. After passivation, the metallic layer is patterned by further etching, stopping on a surface of the gate dielectric.

DETAILED DESCRIPTION OF THE INVENTION

The present invention, which provides a low-temperature (less than 750° C.) electrically activated gate electrode and a method of fabricating the same, will now be described in greater detail by referring the following discussion and drawings that accompany the present application. The drawings of the present invention, which are referred to in the present application, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention is directed to a gate electrode structure, which includes, from bottom to top, an optional, yet preferred metallic layer, a Ge rich-containing layer and a Si rich-containing layer. The inventive gate electrode structure serves as a low-temperature electrically activated gate electrode of a MOSFET in which the materials thereof as well as the method of fabricating the same are compatible with existing MOSFET fabrication techniques.

The inventive gate electrode structure is electrically activated at low processing temperatures (on the order of less than 750° C.). Additionally, the inventive gate electrode structure also minimizes gate-depletion effects, does not contaminate a standard MOS fabrication facility and has sufficiently low reactivity of the exposed surfaces that renders such a gate electrode structure compatible with conventional MOSFET processing steps.

Reference is first made to FIGS. 1-4 which are pictorial representations (through cross sectional views) depicting the basic processing steps of the present invention which are used in providing a semiconductor structure including the inventive low-temperature electrically activated gate electrode located on a surface of a gate dielectric layer.

Figure 1:
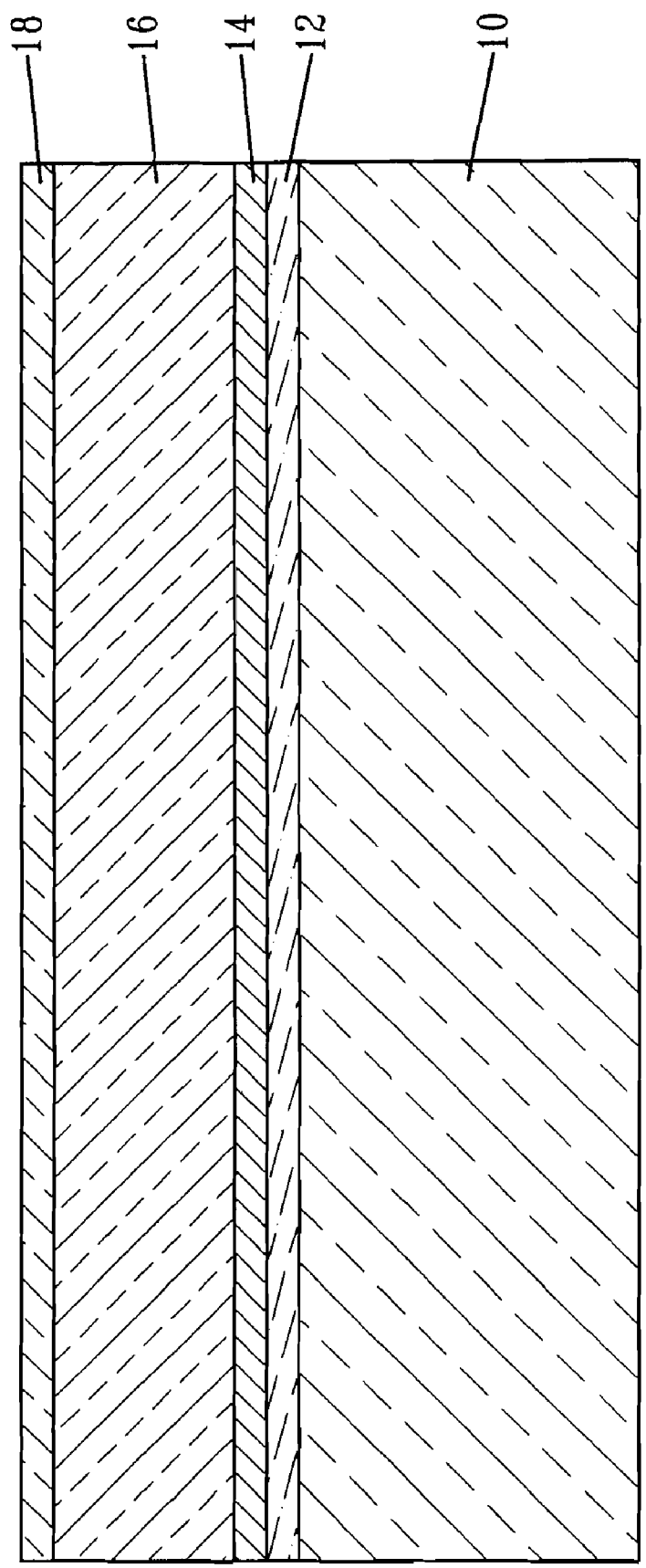
FIGS. 1-4 are pictorial representations (through cross sectional views) illustrating the basic processing steps employed in the present invention for fabricating a low-temperature electrically activated gate electrode.

FIG. 1 shows an initial structure that is formed in the present invention that includes a semiconductor substrate 10, a gate dielectric 12 that is located on a surface of the semiconductor substrate 10, a metallic layer 14 located directly on a surface of the gate dielectric 12, a Ge rich-containing layer 16 located directly on a surface of the metallic layer 14, and a Si rich-containing layer 18 located directly on a surface of the Ge rich-containing layer 16. In some embodiments, not shown in the drawings, an optional oxide or oxynitride layer is present between the gate dielectric 12 and the substrate 10.

The semiconductor substrate 10 of the structure shown in FIG. 1 comprises any semiconducting material including, but not limited to: Si, Ge, SiGe, SiC, SiGeC, Ge, GaAs, CaN, InAs, InP and all other III/V or II/VI compound semiconductors. Semiconductor substrate 10 may also comprise an organic semiconductor or a layered semiconductor such as Si/SiGe, a silicon-on-insulator (SOI), a SiGe-on-insulator (SGOI) or germanium-on-insulator (GOI). The surface of substrate 10 may be comprised of one or more heterostructure layers such as (top-down) Si/Ge/SiGe, Ge/SiGe, Si/SiGe/Si, or SiGe/Si to serve as high-mobility channel layers. In some embodiments of the present invention, it is preferred that the semiconductor substrate 10 be composed of a Si-containing semiconductor material, i.e., a semiconductor material that includes silicon.

The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art.

The semiconductor substrate 10 may also include a first doped (n- or p-) region, and a second doped (n- or p-) region. For clarity, the doped regions are not specifically shown in the drawings of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

After processing the semiconductor substrate 10, a oxide or oxynitride layer (not shown) is optionally formed on the surface of the semiconductor substrate 10. The optional oxide or oxynitride layer is formed utilizing a conventional growing technique that is well known to those skilled in the art including, for example, oxidation or oxynitridation. The oxide or oxynitride layer is comprised of silicon oxide, silicon oxynitride or a nitrided silicon oxide. When present, the optional oxide or oxynitride layer has a thickness that is typically from about 0.5 to about 1.2 nm, with a thickness from about 0.8 to about 1 nm being more typical.

In accordance with an embodiment of the present invention, the optional oxide or oxynitride layer is a silicon oxide layer having a thickness from about 0.6 to about 0.8 nm that is formed by low-temperature (less than 750° C.) oxidation. The process step for this oxidation includes a rapid thermal process.

Next, a gate dielectric 12 is formed on the surface of the oxide or oxynitride layer, if present, or directly on the surface of the semiconductor substrate 10, if the optional oxide or oxynitride layer 12 is not present, by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes. The gate dielectric 12 may also be formed utilizing any combination of the above processes. A thermal process may also be used in forming the gate dielectric 12.

The gate dielectric 12 comprises any insulating oxide, nitride and/or oxynitride, with oxide containing gate dielectrics being highly preferred. The gate dielectric 12 may include silicon dioxide, silicon nitride or silicon oxynitride. In addition, the gate dielectric 12 employed in the present invention may include a metal oxide, a metal silicide, a metal silicon oxynitride and/or a mixed metal oxide. Examples of metal-containing dielectrics include $TiO_2$, $Al_2O_3$, Zr-based dielectrics, Hf-based dielectrics, $Ta_2O_5$, $La_2O_3$, perovskite-type oxides and other like dielectric materials. The term 'Hf-based dielectric' denotes hafnium oxide ($HfO_2$), hafnium silicate ($HfSiO_x$), Hf silicon oxynitride (HfSiON) or multilayers thereof. In some embodiments, the Hf-based dielectric comprises a mixture of $HfO_2$ and $ZrO_2$. Typically, the Hf-based dielectric is hafnium oxide or hafnium silicate. The term 'Zr based dielectric' denotes zirconium oxide ($ZrO_2$), zirconium silicate ($ZrSiO_x$), zirconium silicon oxynitride (ZrSiON) or multilayers thereof. Typically, the Zr-based dielectric is zirconium oxide.

The physical thickness of the gate dielectric 12 may vary, but typically, the gate dielectric 12 has a thickness from about 0.5 to about 10 nm, with a thickness from about 0.5 to about 3 nm being more typical.

Next, a metallic layer 14 is formed directly on the surface of the gate dielectric layer 12 utilizing a conventional deposition process. It is noted that in some embodiments of the present invention, the metallic layer 14 is optional and is not present in the material stack; in such embodiments, the subsequently formed Ge rich-containing layer is formed directly on a surface of the gate dielectric 12.

Examples of conventional depositions that can be used in forming the metallic layer 14 include CVD, PVD, ALD, sputtering or evaporation. The metallic layer 14 is formed directly on the surface of the gate dielectric 12 utilizing a conventional deposition process in which the vacuum between depositions may or may not be broken.

The metallic layer 14 comprises a metallic material that is capable of conducting electrons. Specifically, the metallic layer 14 includes a metal nitride or a metal silicon nitride. The metallic layer 14 provides the functions of (a) protecting the gate dielectric from the ambient, (b) acting as a diffusion barrier to ambient oxygen, (c) preventing reaction of the Ge rich-containing layer (to be subsequently formed with the gate dielectric) and, more importantly, (d) providing a platform in which a Ge rich-containing layer can be formed without significantly increasing gate-depletion effects.

It is noted that the metal component of the metallic layer 14 comprises a metal from Group IVB or VB of the Periodic Table of Elements (using CAS nomenclature). Hence, the metallic layer 14 may include Ti, Zr, Hf, V, Nb or Ta, with Ti or Ta being highly preferred. By way of example, the metallic layer 14 preferably comprises TiN or TaN.

The physical thickness of the metallic layer 14 may vary, but typically, the metallic layer 14 has a thickness from about 0.5 to about 300 nm, with a thickness from about 5 to about 150 nm being more typical.

In one embodiment of the present invention, the metallic layer 14 is TiN that is deposited by evaporating Ti from an effusion cell held in the range of 1550° to 1900° C., typically 1600° to 1750° C., and using an atomic/excited beam of nitrogen that is passed through a remote radio frequency source. The substrate temperature can be around 300° C. and the nitrogen flow rate can be between 0.5 sccm and 3.0 seem. These ranges are exemplary and by no way limit the present invention. The nitrogen flow rate depends upon the specifics of the deposition chamber, in particularly, the pumping rate on the chamber. The TiN may be deposited, in other ways, as well, such as chemical vapor deposition or sputtering and the technique is not critical.

Following the formation of the metallic layer 14, the Ge rich-containing layer 16 is formed directly on the surface of the metallic layer 14 if present, or it can be formed directly on the gate dielectric 12 if the metallic layer 14 is not present. As indicated above, the term "Ge rich-containing" denotes a material having a Ge content that is greater than 40 atomic % up to, and including 100 atomic %. Preferably, the Ge content in a Ge alloy is from about 50 to about 100 atomic %. As such, the Ge rich-containing layer 16 can include a Ge alloy or pure Ge. Examples of Ge alloys include $Si_{(1-x)}Ge_x$, where x is the atomic fraction of Ce in the alloy. Preferably, the Ge rich-containing layer 16 comprises at least one of pure Ge or SiGe in which the content of Ge is greater than 40 atomic %.

The Ge rich-containing layer 16 can be formed in an amorphous state or it can be formed in a polycrystalline state. The Ge rich-containing layer 16 can be doped (in-situ or ex-situ) or undoped. The present invention also contemplates instances in which portions of the Ge rich-containing layer 16 are doped with a first dopant and other portions are undoped or doped with a different conductivity type second dopant. An amorphous Ge rich-containing layer can be formed by evaporation or sputtering, while chemical vapor deposition (CVD), plasma enhanced chemical vapor deposition (PECVD), PVD or ALD can be used to form a polycrystalline layer.

In-situ doping occurs when the dopant species (typically Group IIIA ions or Group VA ions) are added during the deposition process. In one embodiment, in-situ doping of Ge rich-containing layer 16 is accomplished by flowing a dopant-containing gas such as diborane ($B_2H_6$) gas during the CVD growth of layer 16. Ex-situ doping occurs by first depositing the Ge rich-containing layer, without any dopant species in the precursor gases, and then introducing the dopant species by means of ion implantation, gas phase doping or diffusion. The in-situ doped Ge rich-containing layer and the ex-situ doped Ge rich-containing layer can be thermally activated by annealing at a temperature of less than 750° C.

The thickness, i.e., height, of the Ge rich-containing layer 16 deposited at this point of the present invention may vary depending on the deposition process employed. Typically, the Ge rich-containing layer 16 has a vertical thickness from about 30 to about 300 nm, with a thickness from about 50 to about 200 nm being more typical. The Ge rich-containing layer 16 provides a highly conductive IC compatible material in the inventive gate electrode structure that can be made conductive at low-activation temperatures of less than 750° C.

A Si rich-containing layer 18 is then formed directly on an exposed surface of the Ge rich-containing layer 16. As indicated above, the term "Si rich-containing" denotes a material having a Si content that is about 60 atomic % or greater up to, and including 100 atomic %. Preferably, the Si content in a Si alloy is from about 70 to about 100 atomic %. As such, the Si rich-containing layer 18 can include a Si alloy or pure Si. Examples of Si alloys include $Si_xGe_{(1-x)}$, where x denotes the atomic fraction of Si in the SiGe alloy. Preferably, the Si rich-containing layer 18 comprises at least one of pure Si or SiGe in which the content of Si is about 60 atomic % or greater.

The Si rich-containing layer 18 can be formed utilizing any known deposition process such as, for example, physical vapor deposition, CVD or evaporation. The Si rich-containing layer 18 can be formed in an amorphous state, single crystal form, or it can be formed in a polycrystalline state. The top Si rich-containing layer 18 of the inventive gate electrode structure chemically passivates the surface of the Ge rich-containing layer 16, and it can also be converted into a metal silicide later in the fabrication process.

The Si rich-containing layer 18 may be doped or undoped. If doped, an in-situ doping deposition process may be employed in forming the same. Alternatively, a doped Si rich-containing layer can be formed by deposition, ion implantation and annealing. The ion implantation and annealing can occur prior to or after a subsequent etching step that patterns the material stack. Illustrative examples of dopant ions for nMOSFETs include elements from Group VA of the Periodic Table of Elements (Group IIIA elements can be used when pMOSFETs are formed). Other doping techniques including gas phase doping and diffusion can also be used to doped the Si rich-containing layer 18 ex-situ.

In some embodiments of the present invention, the ex-situ doping of layers 16 and 18 can occur in one step, or multiple, separate steps as described above can be used. In yet other embodiments of the present invention, the ex-situ doping can be performed with a block mask protecting some portions of either, or both layers 16 and 18. In still yet another embodiment of the present invention, layers 16 and 18 are deposited without breaking vacuum between depositions, or alternatively the vacuum can be broken between the depositions of layers 16 and 18.

The thickness, i.e., height, of the Si rich-containing layer 18 deposited at this point of the present invention may vary depending on the deposition process employed. Typically, the Si rich-containing layer 18 has a vertical thickness from about 2 to about 100 nm, with a thickness from about 5 to about 50 nm being more typical.

Figure 2:
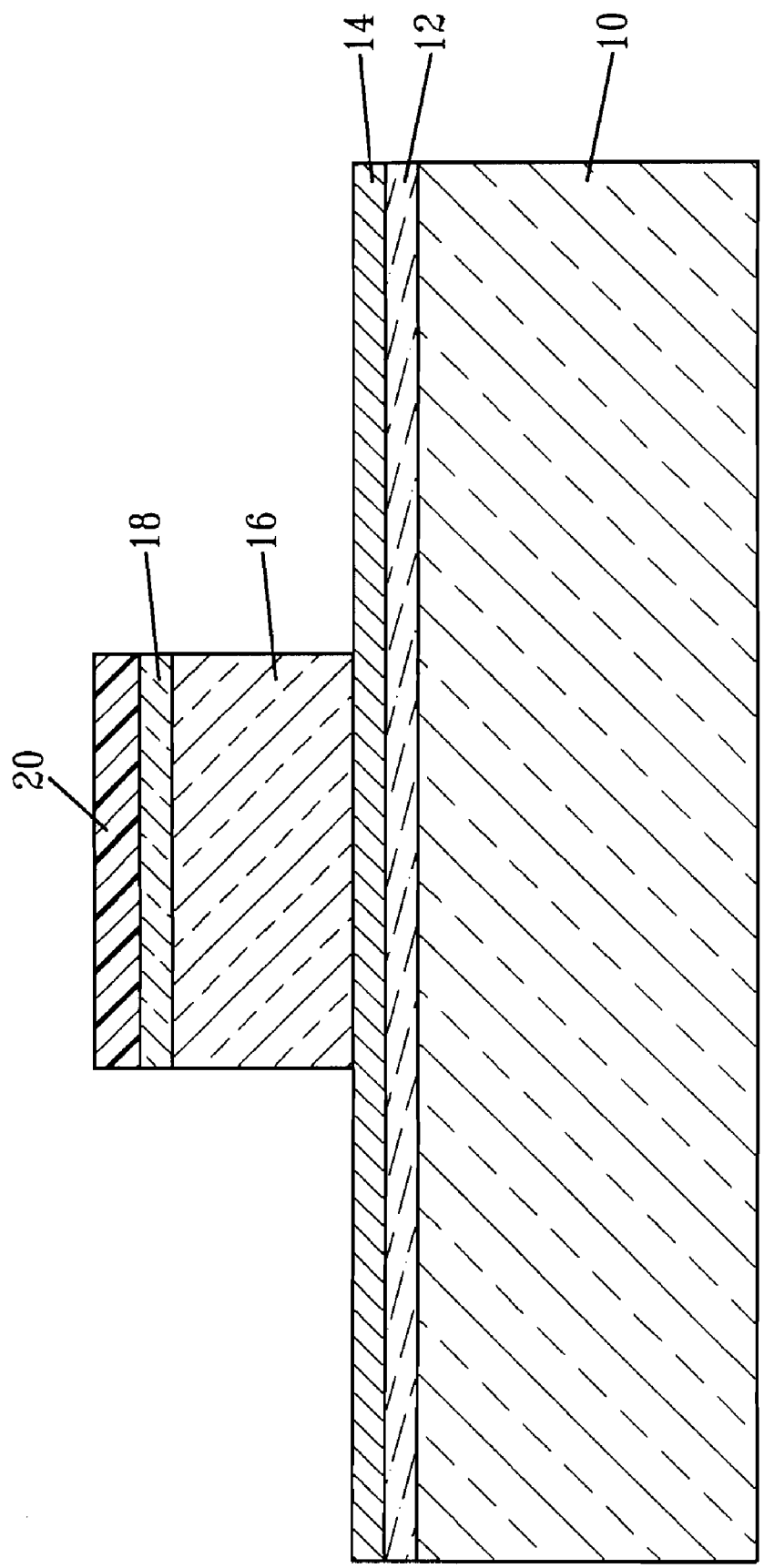

Lithography and etching are then used to pattern the top Si rich-containing layer 18 and the underlying Ge rich-containing layer 16 so as to provide the structure shown, for example, in FIG. 2.

The lithographic step employed in the present invention comprises any conventional lithographic patterning process well known to those skilled in the art. For example, the lithographic step includes forming a photoresist or a material stack of a hard mask and a photoresist atop the Si rich-containing layer 18. If present, the hard mask comprises an oxide, such as silicon dioxide, or a nitride, such as silicon nitride, while the photoresist comprises any conventional resist material (organic, inorganic or hybrid). When a hard mask is present, the hard mask material is formed by any conventional deposition process including, for example, CVD, PECVD, evaporation, chemical solution deposition and the like. Alternatively, the hard mask can be formed by a thermal process such as, for example, oxidation or nitridation. The photoresist is formed by any conventional deposition process such as, for example, CVD, PECVD, evaporation or spin-on coating.

After forming at least the photoresist on the surface of the Si rich-containing layer 18, the photoresist is exposed to a desired pattern of radiation (i.e., a gate conductor pattern) and developed utilizing a conventional resist developer.

An etching step is then used to transfer the pattern from at least the patterned resist to layers 18 and 16, stopping on metallic layer 14. In embodiments when a hard mask is present, the patterned resist is typically, but not necessarily always, removed after transfer of the pattern into the hard mask. The patterned hard mask can remain in the final structure or it can be removed utilizing a conventional stripping process that selectively removes the patterned hard mask from the structure. In FIG. 2, there is shown the presence of a patterned hard mask 20.

In prior art patterning of metal-containing gate stacks, reactive ion etching (RIE) has been typically used to etch through the material layers of the film stack stopping on (or in) the gate dielectric. Generally, RIE chemistries that etch metallic layers tend to etch Ge at a much greater rate, which, in turn, creates unwanted selective undercutting of a Ge-containing layer. In order to avoid such undercutting of the Ge rich-containing layer in the inventive process, the etching step employed in the present invention is performed in two steps. First, and as shown in FIG. 2, a dry etching process (such as, for example, RIE, plasma etching or ion beam etching) is employed that etches layers 16 and 18, stopping on top of metal layer 14. Preferably, RIE is used in the present invention to etch layers 18 and 16.

Prior to etching the metallic layer 14, the exposed sidewalls of the Ge rich-containing layer 16 shown in FIG. 2, are subjected to a passivation step which forms a passivation layer 22 within the exposed sidewalls of the Ge rich-containing layer 16. The resultant structure is shown, for example, in FIG. 3. As shown, the passivation layer 22 is typically a surface layer that forms within the exposed sidewalls of the Ge rich-containing layer 16. That is, the passivation process consumes sidewall portions of the Ge rich-containing layer 16.

The passivation of the exposed sidewalls of the patterned Ge rich-containing layer 16 is performed by one of oxidation, nitridation and oxynitridation. Chemical, plasma and/or thermal passivation can be performed. Of these passivation techniques, chemical or thermal are more preferred. A highly preferred technique used to passivate the exposed sidewalls of the patterned Ge rich-containing layer is to perform either an anneal in a $NH_3$ ambient, or to perform a two-step oxidation/nitridation sequence. Typical nitridation temperatures are from about 525° to about 700° C., with 550° to 650° C. being even more typical. Typical oxidation temperatures are from about 500° to about 700° C., with 520° to 650° C. being even more typical. If chemical or plasma-based oxidation or nitridation methods are used, then typical formation temperatures below 300° C. are typical. The duration of the oxidation and/or nitridation process may vary. Typically, the oxidation and/or nitridation are performed for a duration of about 1 second to about 10 minutes, with a duration of about 10 seconds to about 5 minutes being even more typical.

The passivation layer 22 comprises a germanium or silicon or silicon-germanium oxynitride; a germanium or silicon or silicon-germanium oxide; or a germanium or silicon or silicon-germanium nitride.

The thickness of the passivation layer 22 varies depending on the conditions of the passivation technique used. Typically, the passivation layer 22 has a thickness from about 5 to about 100 Å.

In one embodiment of the present invention, an anneal in $NH_3$ at a temperature about 640° C. for a time period of about 3 minutes is performed. Such an anneal process provides a germanium oxynitride passivation layer having a thickness from about 30 to about 50 Å.

Figure 3:
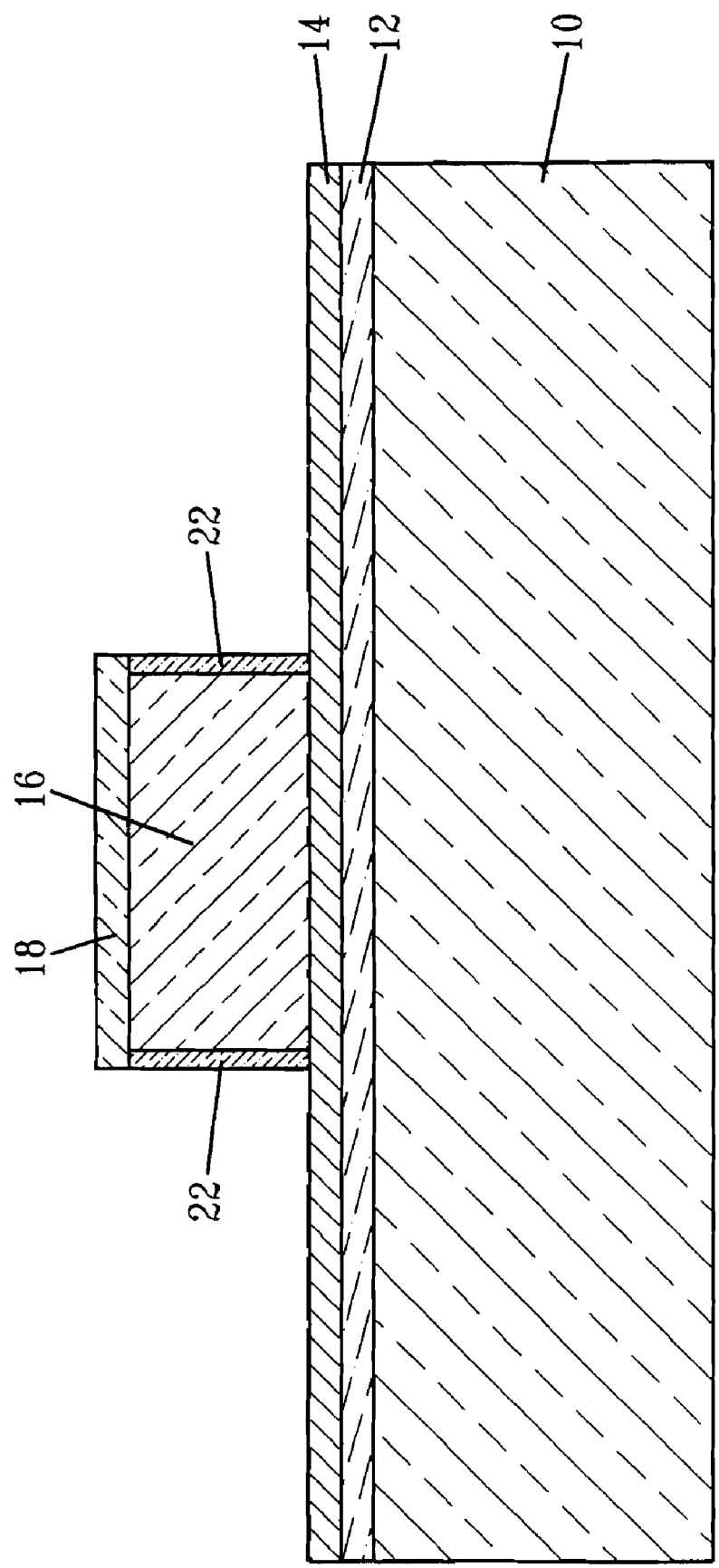
Figure 4:
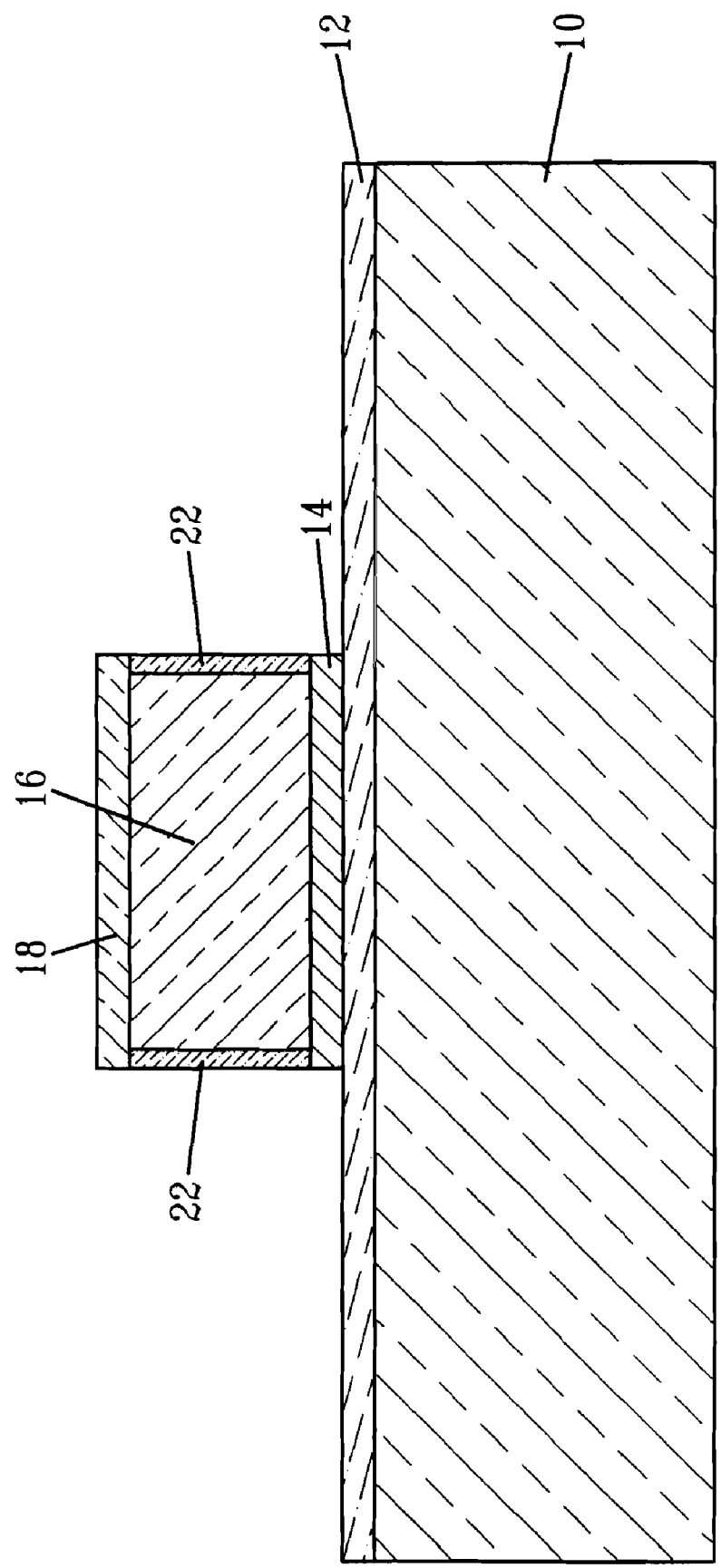

After performing the passivation step and providing the structure shown, for example, in FIG. 3, the exposed metallic layer 14 is then etched, stopping on, or within, a surface of gate dielectric 12. The resultant structure that is formed after etching the metallic layer 14 is shown, for example, in FIG. 4. The etching of the metallic layer 14 is performed utilizing the same or different etching technique that was used above for etching layers 16 and 18. Preferably, RIE is used to etch the metallic layer 14.

Figure 5:
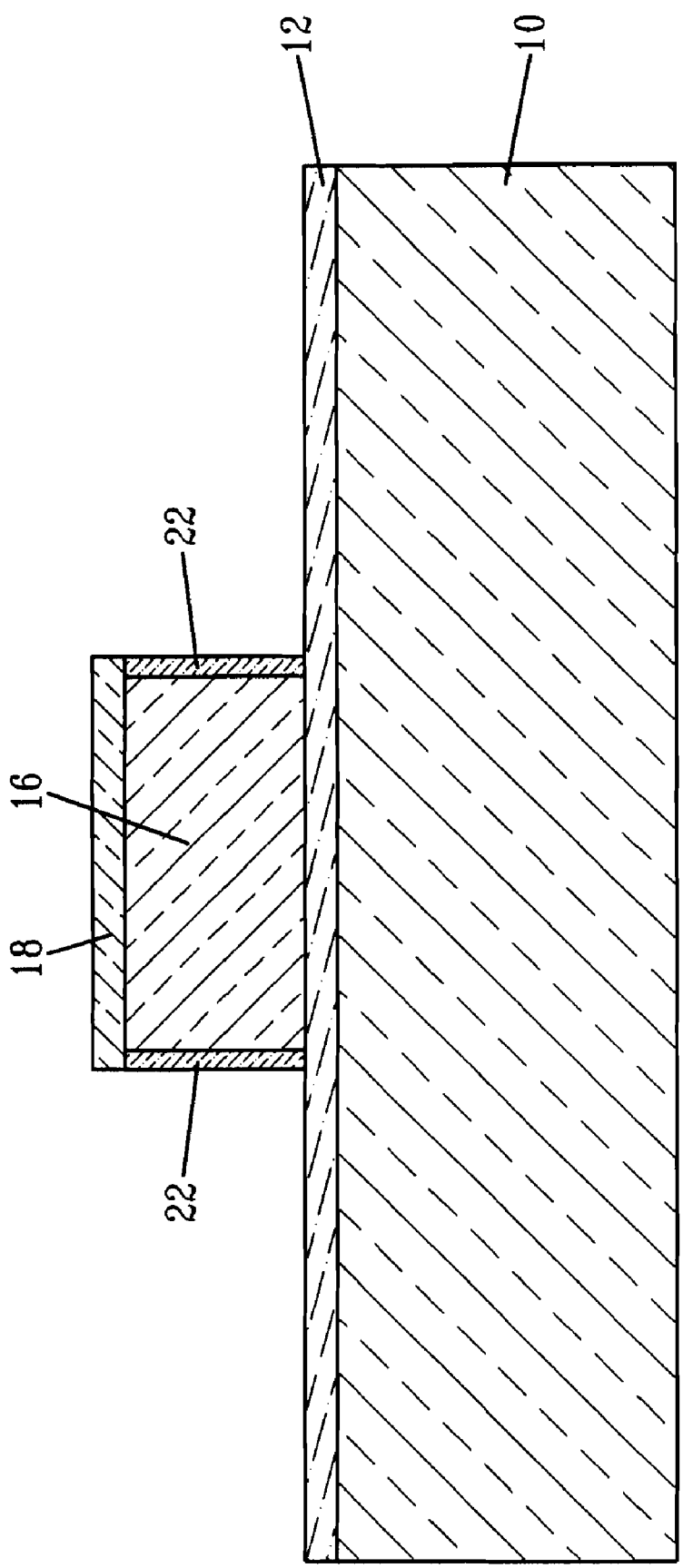
FIG. 5 shows an alternative structure that can be formed in the present application.

In some embodiments of the present invention, the metallic layer 14 is optional. In such embodiments, the Ge rich-containing layer 16 is formed directly on a surface of the gate dielectric 12 and the processing sequence mentioned above, in connection with FIGS. 2-3, are performed. The resultant structure of this alternative embodiment is shown, for example, in FIG. 5.

In either embodiment mentioned above, the gate dielectric 12 may be etched or it may remain unetched. Typically, however, the gate dielectric 12 is etched during the fabrication of a semiconductor device, such as for example, a MOSFET.

The MOSFET formation includes first forming isolation regions within the substrate 10 as described above. A material stack as described above is then formed after removing a sacrificial oxide layer that is used in forming the isolation regions. Following patterning of the material stack utilizing the inventive method, at least one spacer is typically, but not always, formed on exposed sidewalls of each patterned material stack. The at least one spacer is comprised of an insulator such as an oxide, nitride, oxynitride and/or any combination thereof. The at least one spacer is formed by deposition and etching.

The width of the at least one spacer must be sufficiently wide such that the source and drain silicide contacts do not encroach underneath the edges of the patterned material stack. Typically, the source/drain silicide does not encroach underneath the edges of the patterned material stack when the at least one spacer has a width, as measured at the bottom, from about 20 to about 80 nm.

Source/drain diffusion regions are then formed into the substrate. The source/drain diffusion regions are formed utilizing ion implantation and an annealing step. The annealing step serves to activate the dopants that were implanted by the previous implant step. The conditions for the ion implantation and annealing are well known to those skilled in the art. The source/drain diffusion regions may also include extension implant regions, which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some cases, a forming gas anneal (5-10% hydrogen) can follow which is performed between 500° to 550° C. for oxide or nitride layer/semiconductor substrate interface state passivation. Further CMOS processing such as formation of silicided contacts (source/drain and gate) as well as formation of BEOL (back-end-of-the-line) interconnect levels with metal interconnects can be formed utilizing processing steps that are well known to those skilled in the art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A gate electrode structure comprising:
   a patterned material stack located on a surface of a gate dielectric, said patterned material stack comprising, from bottom to top, a Ge rich-containing layer and a Si rich-containing layer, said Ge rich-containing layer consisting of a Ge rich-containing semiconductor material and said Si rich-containing layer consisting of a Si rich-containing semiconductor material, wherein said Ge rich-containing semiconductor material is an alloy of Si and Ge having a composition of $Si_{(1-x)}Ge_x$, and wherein x is a number between 0.4 and 1.0; and
   a surface passivation layer located directly on sidewalls of said Ge rich-containing layer, wherein said surface passivation layer comprises a silicon-germanium oxynitride, a silicon-germanium oxide, or a silicon-germanium nitride, and said surface passivation layer contacts sidewalls of said Ge rich-containing layer and does not contact sidewalls of said Si rich-containing layer, and all sidewalls of said Si rich-containing layer are exposed surfaces that are located above an interface between said Ge rich-containing layer and said Si rich-containing layer.

2. The gate electrode structure of claim 1 further comprising a metallic layer located beneath said Ge rich-containing layer directly on said surface of said gate dielectric.

3. The gate electrode structure of claim 2 wherein said metallic layer is a metal nitride of a metal or a metal silicon nitride of said metal, wherein said metal is selected from Group IVB or VB of the Periodic Table of Elements.

4. The gate electrode structure of claim 3 wherein said metallic layer is a metal nitride consisting essentially of nitrogen and a metal, wherein said metal is selected from Group IVB or VB of the Periodic Table of Elements.

5. The gate electrode structure of claim 1 wherein said Si rich-containing layer comprises pure Si or a SiGe alloy including about 60 atomic % or greater Si.

6. A semiconductor structure comprising:
   a semiconductor substrate;
   a gate dielectric located on a surface of said semiconductor substrate;
   a patterned material stack located on a surface of a gate dielectric, said patterned material stack comprising, from bottom to top, a Ge rich-containing layer and a Si rich-containing layer, said Ge rich-containing layer consisting of a Ge rich-containing semiconductor material and said Si rich-containing layer consisting of a Si rich-containing semiconductor material;
   a surface passivation layer located directly on sidewalls of said Ge rich-containing layer, wherein said surface passivation layer contacts sidewalls of said Ge rich-containing layer and does not contact sidewalls of said Si rich-containing layer, and all sidewalls of said Si rich-containing layer are exposed surfaces that are located above an interface between said Ge rich-containing layer and said Si rich-containing layer; and a metallic layer located beneath said Ge rich-containing layer and directly on said surface of said gate dielectric, wherein said metallic layer is a metal nitride consisting essentially of nitrogen and a metal, and wherein said metal is selected from Group IVB or VB of the Periodic Table of Elements.

7. The semiconductor structure of claim 6 wherein said Ge rich-containing layer is an alloy of Si and Ge having a composition of $Si_{(1-x)}Ge_x$, and wherein x is a number between 0.4 and 1.0.

8. The semiconductor structure of claim 6 wherein said Si rich-containing layer comprises pure Si or a SiGe alloy including about 60 atomic % or greater Si.

9. The semiconductor structure of claim 6 wherein said surface passivation layer comprises a germanium or silicon or silicon-germanium oxynitride, a germanium or silicon or silicon-germanium nitride, or a germanium or silicon or silicon-germanium oxide.

10. The semiconductor structure of claim 9 wherein said surface passivation layer comprises a silicon-germanium oxynitride, a silicon-germanium oxide, or a silicon-germanium nitride.

11. The semiconductor structure of claim 6 wherein said semiconductor substrate is a Si-containing substrate.

12. A method of forming a gate electrode structure comprising:

providing a material stack comprising, from bottom to top, a Ge rich-containing layer and a Si rich-containing layer, on a surface of a gate dielectric, said Ge rich-containing layer consisting of a Ge rich-containing semiconductor material and said Si rich-containing layer consisting of a Si rich-containing semiconductor material, wherein said Ge rich-containing semiconductor material is an alloy of Si and Ge having a composition of $Si_{(1-x)}Ge_x$, and wherein x is a number between 0.4 and 1.0;

patterning the Si rich-containing layer and the Ge rich-containing layer by lithography and etching to provide at least one patterned material stack on said surface of said gate dielectric; and converting sidewall portions of said Ge rich-containing layer into a surface passivation layer by passivating said sidewall portions of said Ge rich-containing layer wherein said surface passivation layer comprising a silicon-germanium oxynitride, a silicon-germanium oxide, or a silicon-germanium nitride is formed directly on a remaining portion of said Ge rich-containing layer, and said surface passivation layer contacts sidewalls of said remaining portion of said Ge rich-containing layer and does not contact sidewalls of said Si rich-containing layer, and all sidewalls of said Si rich-containing layer are exposed surfaces that are located above an interface between said Ge rich-containing layer and said Si rich-containing layer after said converting.

13. The method of claim 12 wherein said material stack further comprises a metallic layer located beneath said Ge rich-containing layer directly on said surface of said gate dielectric, and wherein said method further includes, following said passivating, etching of the metallic layer.

14. The gate electrode structure of claim 13 wherein said metallic layer is a metal nitride consisting essentially of nitrogen and a metal, wherein said metal is selected from Group IVB or VB of the Periodic Table of Elements.

15. The method of claim 12 wherein said etching comprises reactive ion etching.

16. The method of claim 12 wherein said passivating comprises oxidation, nitridation or oxynitridation by chemical, plasma or thermal means.

17. The method of claim 12 wherein said passivating comprises annealing in $NH_3$ or a two-step sequence of oxidation/nitridation.

18. The method of claim 12 wherein said Ge rich-containing layer and said Si rich-containing layer are doped in-situ.

19. The method of claim 12 wherein said Ge rich-containing layer and said Si rich-containing layer are doped ex-situ.

* * * * *